United States Patent  
Fu et al.

(10) Patent No.: US 7,642,835 B1
(45) Date of Patent: Jan. 5, 2010

(54) SYSTEM FOR SUBSTRATE POTENTIAL REGULATION DURING POWER-UP IN INTEGRATED CIRCUITS

(76) Inventors: Robert Fu, 10184 Macadam La., Cupertino, CA (US) 95014; Tien-Min Chen, 1049 Jacqueline Way, San Jose, CA (US) 95129

( * ) Notice: Subject to any disclaimer, the term of this patent is extended or adjusted under 35 U.S.C. 154(b) by 185 days.

(21) Appl. No.: 10/712,523

(22) Filed: Nov. 12, 2003

(51) Int. Cl.
*H03K 3/01* (2006.01)
*H01L 25/00* (2006.01)

(52) U.S. Cl. ..................................... 327/534; 327/565
(58) Field of Classification Search .......... 327/534–537, 327/565; 257/299, 901
See application file for complete search history.

(56) References Cited

U.S. PATENT DOCUMENTS

| | | | |
|---|---|---|---|
| 4,798,974 A * | 1/1989 | Reczek et al. ............... | 327/546 |
| 5,086,501 A | 2/1992 | DeLuca et al. | |
| 5,167,024 A | 11/1992 | Smith et al. | |
| 5,201,059 A | 4/1993 | Nguyen | |
| 5,204,863 A | 4/1993 | Saint-Joigny et al. | |
| 5,218,704 A | 6/1993 | Watts, Jr. et al. | |
| 5,230,055 A | 7/1993 | Katz et al. | |
| 5,239,652 A | 8/1993 | Seibert et al. | |
| 5,386,135 A * | 1/1995 | Nakazato et al. ............ | 257/369 |
| 5,422,591 A * | 6/1995 | Rastegar et al. ............. | 327/409 |
| 5,422,806 A | 6/1995 | Chen et al. | |
| 5,440,520 A | 8/1995 | Schutz et al. | |
| 5,461,266 A | 10/1995 | Koreeda et al. | |
| 5,502,838 A | 3/1996 | Kikinis | |
| 5,511,203 A | 4/1996 | Wisor et al. | |
| 5,519,309 A | 5/1996 | Smith | |
| 5,560,020 A | 9/1996 | Nakatani et al. | |
| 5,592,173 A | 1/1997 | Lau et al. | |
| 5,682,093 A | 10/1997 | Kivela | |
| 5,717,319 A | 2/1998 | Jokinen | |
| 5,719,800 A | 2/1998 | Mittal et al. | |
| 5,727,208 A | 3/1998 | Brown | |
| 5,745,375 A | 4/1998 | Reinhardt et al. | |
| 5,752,011 A | 5/1998 | Thomas et al. | |

(Continued)

FOREIGN PATENT DOCUMENTS

EP 0381021 8/1990

(Continued)

OTHER PUBLICATIONS

Merriam-Webster's Collegiate Dictionary, tenth Edition, pp. 252 and 603 (Meeriam-Webster, Inc., Springfield, MAss. (USA) (1998).*

(Continued)

*Primary Examiner*—Evan Pert

(57) ABSTRACT

An integrated circuit with body-bias inputs coordinated by a switch at initial power application. A switch coupled to the N-well bias and P-type substrate bias lines of an integrated circuit selectively couples the substrate to ground or the substrate bias supply, depending upon the state of the bias supply lines. During power-up and the initial application of the N-well bias, the substrate is coupled to ground to prevent a leakage induce rise in the substrate potential. Upon sensing the presence of the substrate bias potential on the substrate bias line, the switch couples the substrate to the substrate bias line instead of ground. In another embodiment, a switch indirectly senses the availability of the substrate bias potential by sensing a charge pump enable signal.

39 Claims, 5 Drawing Sheets

U.S. PATENT DOCUMENTS

| | | | |
|---|---|---|---|
| 5,754,869 | A | 5/1998 | Holzhammer et al. |
| 5,757,171 | A | 5/1998 | Babcock |
| 5,778,237 | A | 7/1998 | Yamamoto et al. |
| 5,812,860 | A | 9/1998 | Horden et al. |
| 5,815,724 | A | 9/1998 | Mates |
| 5,825,674 | A | 10/1998 | Jackson |
| 5,848,281 | A | 12/1998 | Smalley et al. |
| 5,884,049 | A | 3/1999 | Atkinson |
| 5,894,577 | A | 4/1999 | MacDonald et al. |
| 5,923,545 | A | 7/1999 | Nguyen |
| 5,933,649 | A | 8/1999 | Lim et al. |
| 5,940,785 | A | 8/1999 | Georgiou et al. |
| 5,940,786 | A | 8/1999 | Steeby |
| 5,974,557 | A | 10/1999 | Thomas et al. |
| 5,996,083 | A | 11/1999 | Gupta et al. |
| 5,996,084 | A | 11/1999 | Watts |
| 6,035,407 | A | 3/2000 | Gebara et al. |
| 6,047,248 | A | 4/2000 | Georgiou et al. |
| 6,048,319 | A | 4/2000 | Hudgins et al. |
| 6,048,746 | A | 4/2000 | Burr |
| 6,087,892 | A | 7/2000 | Burr |
| 6,091,283 | A | 7/2000 | Murgula et al. |
| 6,118,306 | A | 9/2000 | Orton et al. |
| 6,119,241 | A | 9/2000 | Michail et al. |
| 6,157,092 | A | 12/2000 | Hofmann |
| 6,202,104 | B1 | 3/2001 | Ober |
| 6,216,235 | B1 | 4/2001 | Thomas et al. |
| 6,218,708 | B1 | 4/2001 | Burr |
| 6,272,642 | B2 | 8/2001 | Pole, II et al. |
| 6,279,048 | B1 | 8/2001 | Fadavi-Ardekani et al. |
| 6,304,824 | B1 | 10/2001 | Bausch et al. |
| 6,311,287 | B1 | 10/2001 | Dischler et al. |
| 6,314,522 | B1 | 11/2001 | Chu et al. |
| 6,345,363 | B1 | 2/2002 | Levy-Kendler |
| 6,347,379 | B1 | 2/2002 | Dai et al. |
| 6,378,081 | B1 | 4/2002 | Hammond |
| 6,388,432 | B2 | 5/2002 | Uchida |
| 6,415,388 | B1 | 7/2002 | Browning et al. |
| 6,427,211 | B2 | 7/2002 | Watts, Jr. |
| 6,442,746 | B1 | 8/2002 | James et al. |
| 6,457,135 | B1 | 9/2002 | Cooper |
| 6,466,077 | B1 | 10/2002 | Miyazaki et al. |
| 6,477,654 | B1 | 11/2002 | Dean et al. |
| 6,487,668 | B2 | 11/2002 | Thomas et al. |
| 6,489,224 | B1 | 12/2002 | Burr |
| 6,510,400 | B1 | 1/2003 | Moriyama |
| 6,510,525 | B1 | 1/2003 | Nookala et al. |
| 6,513,124 | B1 | 1/2003 | Furuichi et al. |
| 6,519,706 | B1 | 2/2003 | Ogoro |
| 6,574,739 | B1 | 6/2003 | Kung et al. |
| 6,600,346 | B1 | 7/2003 | Macaluso |
| 6,784,722 | B2 | 8/2004 | Tang et al. |
| 6,791,146 | B2 * | 9/2004 | Lai et al. ............... 257/362 |
| 6,792,379 | B2 | 9/2004 | Ando |
| 6,803,633 | B2 * | 10/2004 | Mergens et al. ............ 257/358 |
| 6,992,508 | B2 | 1/2006 | Chow |
| 2002/0026597 | A1 | 2/2002 | Dai et al. |
| 2002/0073348 | A1 | 6/2002 | Tani |
| 2002/0083356 | A1 | 6/2002 | Dai |
| 2002/0087896 | A1 | 7/2002 | Cline et al. |
| 2002/0113628 | A1 | 8/2002 | Ajit |
| 2002/0116650 | A1 | 8/2002 | Halepete et al. |
| 2002/0138778 | A1 | 9/2002 | Cole et al. |
| 2002/0140494 | A1 | 10/2002 | Thomas et al. |
| 2002/0194509 | A1 | 12/2002 | Plante et al. |
| 2003/0014998 | A1 | 1/2003 | Cabo |
| 2003/0036876 | A1 | 2/2003 | Fuller, III et al. |
| 2003/0037008 | A1 | 2/2003 | Raju et al. |
| 2003/0065960 | A1 | 4/2003 | Rusu et al. |
| 2003/0074591 | A1 | 4/2003 | McClendon et al. |
| 2004/0025061 | A1 | 2/2004 | Lawrence |
| 2004/0073821 | A1 | 4/2004 | Naveh et al. |
| 2005/0160465 | A1 | 7/2005 | Walker |

FOREIGN PATENT DOCUMENTS

| | | |
|---|---|---|
| EP | 0474963 | 3/1992 |
| EP | 0501655 | 9/1992 |
| JP | 409185589 | 7/1997 |
| WO | 0127728 | 4/2001 |

OTHER PUBLICATIONS

Hsu, Jui-Ching, "Fabrication of Single Walled Carbon Nanotube (SW-CNT) Cantilevers for Chemical Sensing", M. Sc. Thesis, Lousiana State University, Dec. 2007.*

Final OA Dated Sep. 3, 2009; U.S. Appl. No. 11/241,552.

Non Final OA Dated Feb. 25, 2008; U.S. Appl. No. 11/241,552.

Non Final OA Dated Aug. 21, 2007; U.S. Appl. No. 11/241,552.

Non Final OA Dated Oct. 3, 2008; U.S. Appl. No. 11/241,552.

Computer Software, Wikipedia, http://en.wikipedia.org/wiki.software, retrieved May 2, 2007.

"High Speed, Digitally Adjusted Stepdown Controllers for Notebook CPUS", Maxim Manual, pp. 11 & 21.

"Operation U ( Refer to Functional Diagram)". TLC 1736, Linear Technology Manual, p. 9.

"Wafer Burn-In Isolation Circuit", IBM Technical Disclosure Bulletin, IBM Corp., New York, US, vol. 32, No. 6B, Nov. 1, 1989, pp. 442-443, XP00073858 ISSN: 0018-8689 the whole document.

Baker K et al., "SHMOO Plotting: The Black Art of IC Testing", IEEE Design and Test of Computers, IEEE vol. 14, No. 3, Jul. 1, 1997, pp. 90-97, XP000793305 ISSN: 0740-7475 the whole document.

Desai et al., "Sizing of Clock Distribution Networks for High Performance CPU Chips", Digital Equipment Corporation, Hudson, MA, pp. 389-394, 1996.

Movielink, LLC, Movielink Website, various webpages, http://www.movielink.com/, accessed Jan. 10, 2006.

Apple Computer, Inc., Apple QuickTime, various webpages, http://www.apple.com/quicktime/, accessed Jan. 10, 2006.

Apple Computer, Inc., QuickTime 7 Technology Brief, Nov. 2005.

Apple Computer, Inc., QuickTime 7 User's Guide, Nov. 16, 2005.

Apple Computer, Inc., QuickTime Guide for Windows, Jan. 10, 2006.

* cited by examiner

US 7,642,835 B1

SYSTEM FOR SUBSTRATE POTENTIAL REGULATION DURING POWER-UP IN INTEGRATED CIRCUITS

FIELD OF THE INVENTION

Embodiments of the present invention relate to circuits for providing operational voltages in complementary metal-oxide semiconductor (CMOS) circuits. In particular, embodiments of the present invention relate to a charge pump circuit with a variable output.

BACKGROUND ART

As the operating voltages for CMOS transistor circuits have decreased, variations in the threshold voltages for the transistors have become more significant. Although low operating voltages offer the potential for reduced power consumption, threshold voltage variations due to process and environmental variables often prevent optimum efficiency and performance from being achieved due to increased leakage currents.

Prior Art FIG. 1 shows a conventional CMOS inverter 100. A P-type substrate 105 supports an NFET 110 and a PFET 120. The NFET 110 comprises a gate 112, source 113, and drain 114. The PFET 120 resides in an n-well 115, and comprises a gate 122, drain 123, and a source 124. The substrate 105 and source 113 are coupled by a tie 130 that is connected to ground (GND), while source 124 and N-well 115 are coupled by a tie 135 that is connected to a supply voltage ($V_{DD}$). The input to the inverter is applied to the gates 112 and 122, with the output taken from the drain contact 125. In this conventional configuration, the transistors are often treated as three terminal devices.

Threshold voltage variations may be compensated for by body-biasing. Body-biasing introduces a reverse bias potential between the bulk and the source of the transistor that allows the threshold voltage of the transistor to be adjusted electrically. The purpose of body-biasing is to compensate for 1) process variations; 2) temperature variations; 3) supply voltage variations; 4) changes in frequency of operation; and 5) changing levels of switching activity.

Prior Art FIG. 2 shows an inverter having connections for body-biasing. Body-bias can provided to the PFET 120 through a direct bias contact 150a, or by a buried n-well 140 using contact 150b. Similarly, body-bias may be provided to the NFET 110 by a surface contact 155a, or by a backside contact 155b. An aperture 145 may be provided in the buried n-well 125 so that the bias potential reaches the NFET 110. In general, a PFET 120 or an NFET 110 may be biased by one of the alternative contacts shown.

In integrated circuits that employ body-biasing, the transistors are effectively four terminal devices, and the substrate potential is not be maintained at ground. When the substrate bias supply (e.g., $V_{BBP}$) is off the substrate potential may float.

A floating substrate potential can be a problem during the initial application of power to an integrated circuit. When a body-bias (e.g., $V_{BBN}$) is initially applied to an N-well, leakage to the substrate from that N-well may cause the substrate potential to rise. This rise in substrate potential can forward bias the junction between the substrate and N-wells that are not connected to $V_{BBN}$, causing undesired current flow.

SUMMARY OF INVENTION

Thus, a need exists for a system for preventing undesired current flow during power-up in integrated circuits that employ body-biasing.

Accordingly, embodiments of the present invention provide a switch or clamp that responds to conditions at power-up and prevents a circuit substrate from floating.

In one embodiment of the present invention, a bias input ($V_{BBN}$) to an N-well is coupled to a control input for a single-pole, double-throw switch that couples an integrated circuit substrate to ground or to a bias voltage supply ($V_{BBP}$). When $V_{BBN}$ is on and $V_{BBP}$ is off, the switch couples the substrate to ground. When $V_{BBP}$ is on, the switch couples the substrate to $V_{BBP}$.

In another embodiment of the present invention, a bias input ($V_{BBN}$) to an N-well is coupled to a control input for a single-pole, double-throw switch. The switch also has a control input coupled to a charge pump enable signal line ($CP_{ENABLE}$). When $V_{BBN}$ is high and $CP_{ENABLE}$ is low, the switch couples the substrate to ground. $CP_{ENABLE}$ is high, the switch is open.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

DESCRIPTION OF THE PREFERRED EMBODIMENTS

In the following detailed description of the present invention, a variable output charge pump circuit, numerous specific details are set forth in order to provide a thorough understanding of the present invention. However, it will be obvious to one skilled in the art that the present invention may be practiced without these specific details. In other instances well known methods, procedures, components, and circuit elements have not been described in detail as not to unnecessarily obscure aspects of the present invention.

Figure 1:
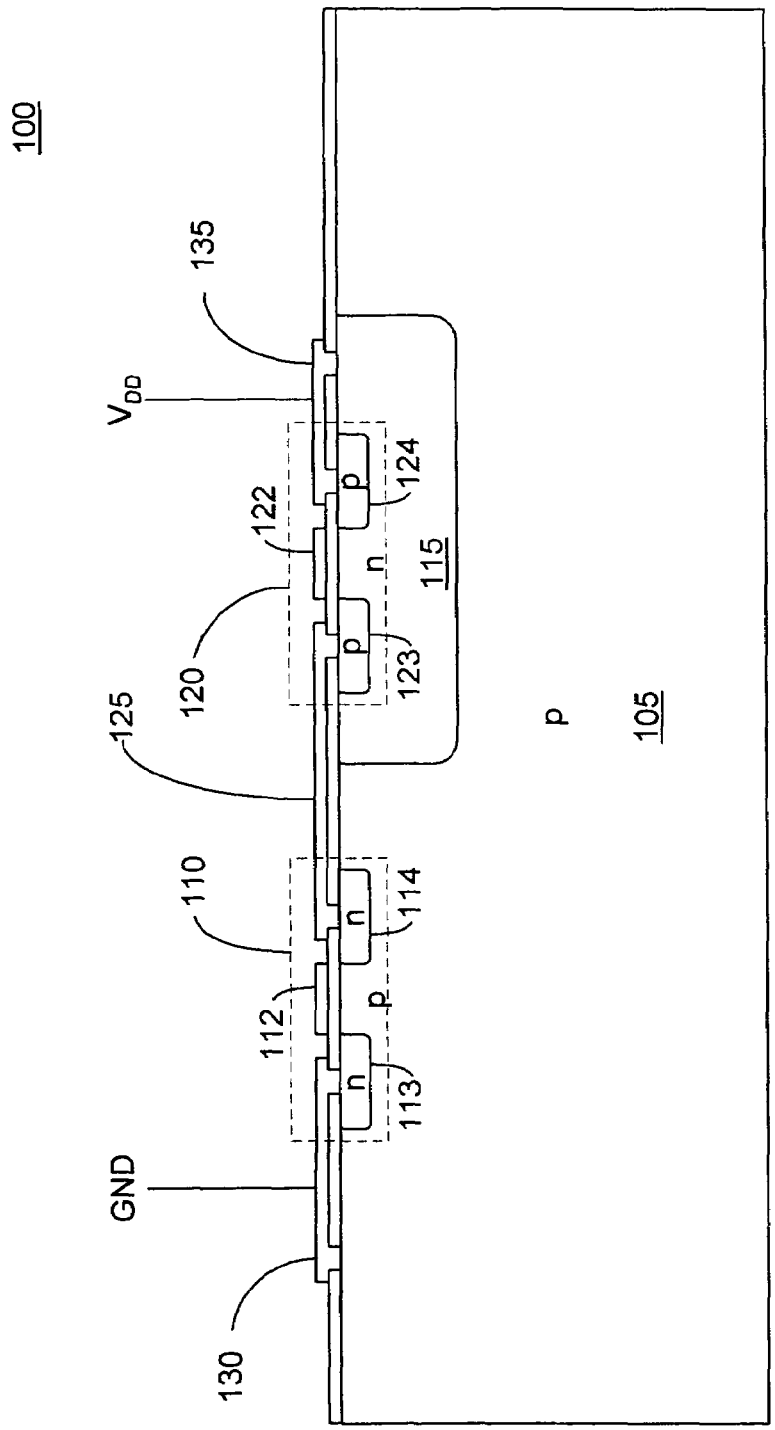
FIG. 1 shows a conventional CMOS inverter without body-bias connections.
Figure 2:
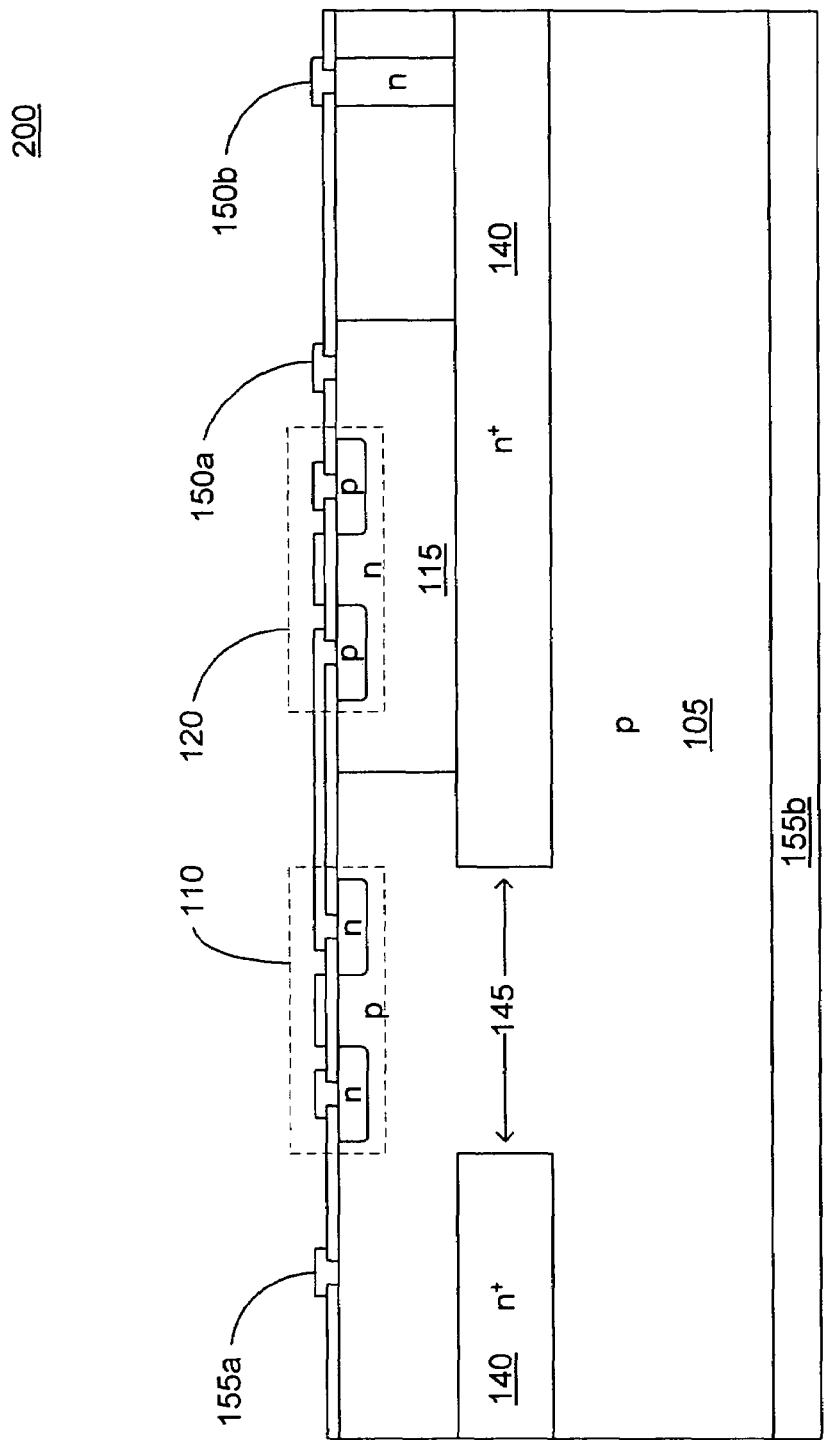
FIG. 2 shows a conventional CMOS inverter with body-bias connections.
Figure 3:
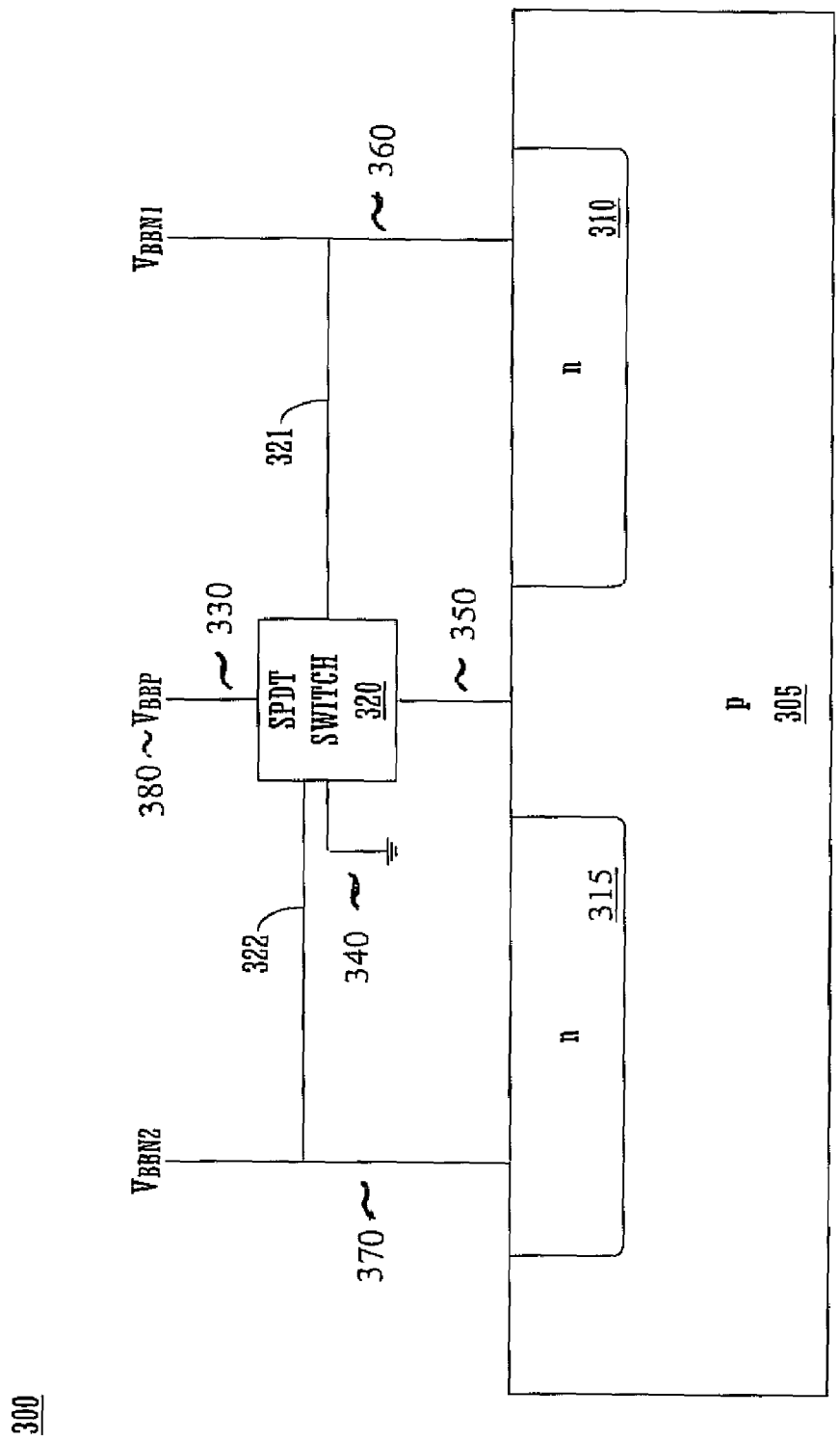
FIG. 3 shows a diagram of a portion of an integrated circuit with body-bias inputs coordinated by a single-pole, double throw (SPDT) switch, in accordance with an embodiment of the present claimed invention.

FIG. 3 shows a diagram 300 of a portion of an integrated circuit with a P-type substrate 305 having a first N-well 310 and a second N-well 315. Body-bias $V_{BBN1}$ 360 is provided to N-well 310 and body-bias $V_{BBN2}$ 370 is provided to N-well 315. Body-bias $V_{BBN1}$ 360 is coupled to switch 320 as a control input 321, and body-bias $V_{BBN2}$ 370 is optionally coupled to switch 320 as a control input 322. The switch 320 has a switched terminal 330 coupled to $V_{BBP}$ 380 and a switched terminal 340 coupled to ground. The switch has a fixed output terminal 350 coupled to the substrate 305. As used herein, the term "coupled" refers to a physical coupling and does not necessarily imply an electrical coupling. Electrical coupling may be made selectively between elements that are physically coupled.

Switch 320 acts as a single-pole, double-throw (SPDT) switch, selectively and electrically coupling the substrate to body bias $V_{BBP}$ 380 or ground, depending upon the state of bias supply lines $V_{BBN1}$ 360, $V_{BBN2}$ 370, and $V_{BBP}$ 380. If $V_{BBN1}$ 360 (or $V_{BBN2}$ 370 if present) is high and $V_{BBP}$ 380 is off, the switch 320 electrically couples the substrate 305 to ground. By electrically coupling the substrate to ground, the switch prevents the substrate from floating up to a potential that could forward bias the junction between the substrate and an unbiased N-well in the integrated circuit.

Operating power is supplied to the switch 320 by a small auxiliary charge pump (not shown) rather than one of the bias lines, since it is desirable that the switch be able to operate regardless of the state of the bias lines.

If $V_{BBP}$ 380 is on (e.g., −1.2 volts) and $V_{BBN1}$ 360 (or $V_{BBN2}$ 370 if present) is high, the switch 320 couples the substrate to $V_{BBP}$ 380. For the case when $V_{BBP}$ 380 is on while $V_{BBN1}$ 360 and $V_{BBN2}$ 370 are low, the switch may be built to switch the substrate to either $V_{BBP}$ 380 or to ground, depending upon other design considerations. For all possible bias input combinations, the switch 320 provides a regulated substrate potential that prevents undesirable forward biasing of the substrate/N-well junction.

For all possible bias input combinations, the switch 320 provides a regulated substrate potential that prevents undesirable forward biasing of the substrate/N-well junction. The switch operates to electrically couple the substrate to a substrate bias voltage or to ground, in response to particular combinations of bias voltages on the N-well and substrate bias lines.

Figure 4:
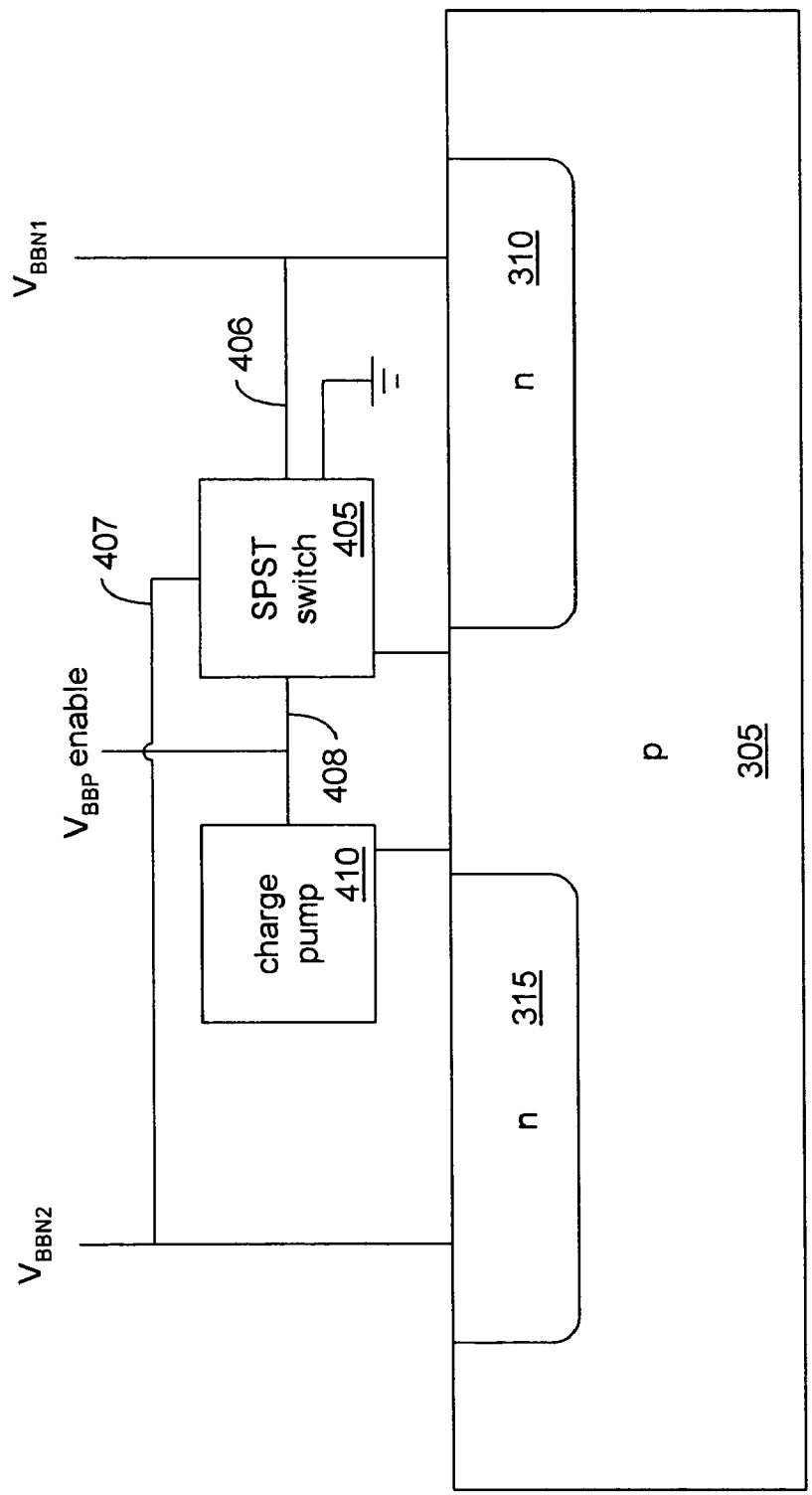
FIG. 4 shows a diagram of a portion of an integrated circuit with body-bias inputs coordinated by a single-pole, single-throw (SPST) switch, in accordance with an embodiment of the present claimed invention.

FIG. 4 shows a diagram 400 of a portion of an integrated circuit with a P-type substrate 305 having a first N-well 310 and a second N-well 315. Body-bias $V_{BBN1}$ is provided to N-well 310 and body-bias $V_{BBN2}$ is provided to N-well 315. Body-bias $V_{BBN1}$ is coupled to switch 405 as a control input 406, and body-bias $V_{BBN2}$ is optionally coupled to switch 405 as a control input 407.

A charge pump 410 having a $V_{BBP}$ enable input is coupled to substrate 305. The $V_{BBP}$ enable input is also coupled to the switch 405 as a control input 408. The charge pump 410 provides the bias potential $V_{BBP}$ for the substrate 305.

Switch 405 acts as a single-pole, double-throw (SPDT) switch, coupling the substrate 305 to ground, depending upon the state of $V_{BBN1}$, $V_{BBN2}$, and $V_{BBP}$ enable. If $V_{BBN1}$ (or $V_{BBN2}$ if present) is high and $V_{BBP}$ enable is low, the switch 405 couples the substrate 305 to ground. By clamping the substrate to ground, the switch prevents the substrate from floating up to a potential that could forward bias the junction between the substrate and an unbiased N-well in the integrated circuit.

If $V_{BBP}$ enable is high and $V_{BBN1}$ (or $V_{BBN2}$ if present) is high, the switch 405 isolates the substrate from ground. It is desirable that the switch 405 be sufficiently fast to isolate the substrate before the charge pump output reaches a significant value. In general, a charge pump turn-on will be slower than that of the switch 405.

Figure 5:
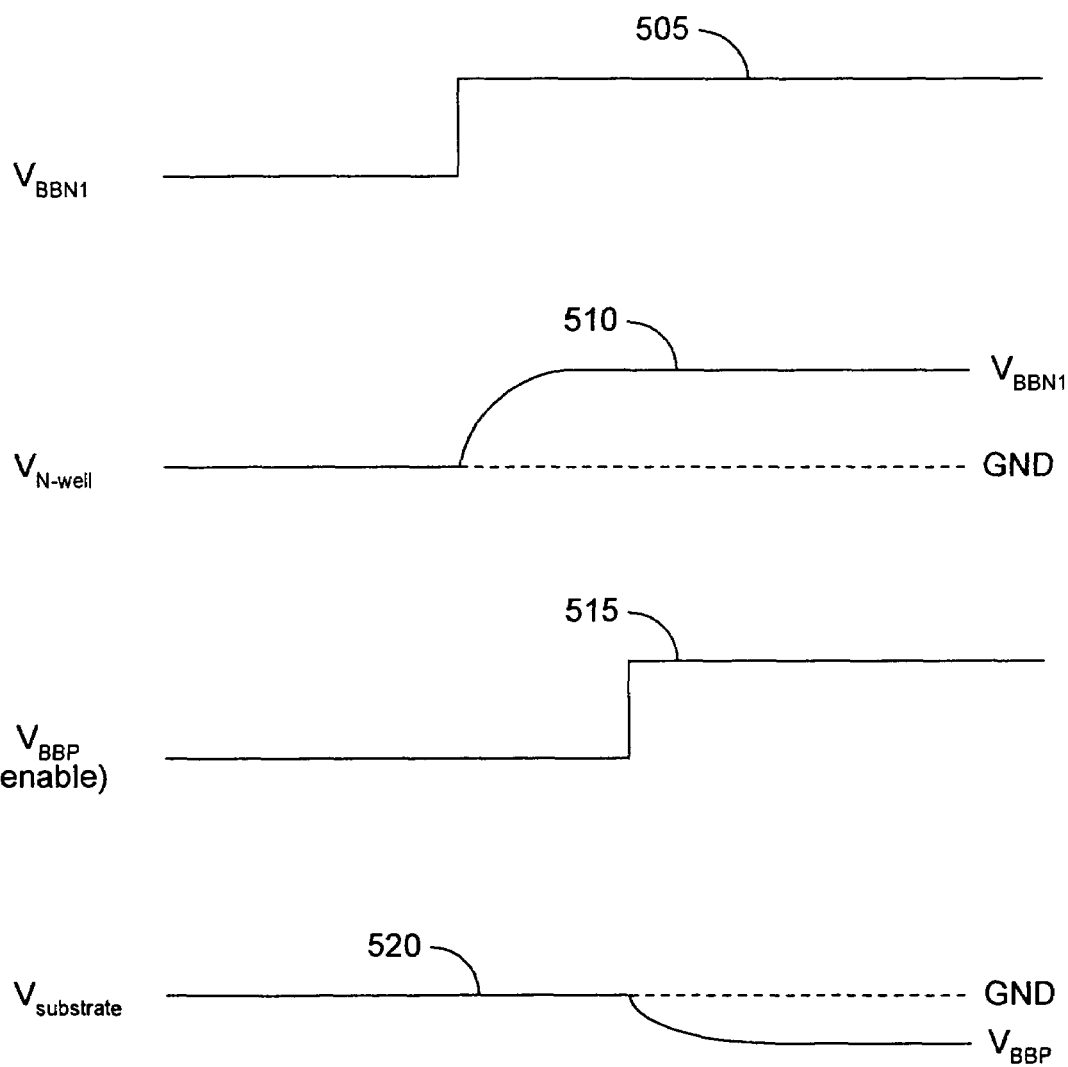
FIG. 5 shows a timing diagram for the body-bias potentials on power-up, in accordance with an embodiment of the present claimed invention.

FIG. 5 shows a representative timing diagram 500 for the body-bias, N-well, and substrate potentials on power-up, in accordance with an embodiment of the present invention. Trace 505 shows the turn-on or enablement of the N-well bias supply $V_{BBN1}$. The sharp edge is idealized, and corresponds to a logic signal initiating the application of $V_{BBN1}$.

Trace 510 shows the voltage of the N-well rising from ground (GND) to $V_{BBN1}$ over time as the capacitance associated junction between the substrate and well is charged. Since bias supplies typically have a low current demand under steady state conditions, the initial rise time is slower than that of trace 505 due to the limited current.

Trace 515 shows the turn-on or enablement of the P-type substrate bias supply $V_{BBP}$. The sharp edge is idealized, and corresponds to a logic signal initiating the application of $V_{BBP}$ (e.g., the signal $V_{BBP}$ enable of FIG. 4). Trace 510 shows the voltage of the P-type substrate dropping from ground (GND) to $V_{BBP}$ over time as the capacitance associated junction between the substrate and well is discharged. Since bias supplies typically have a low current demand under steady state conditions, the initial rise time is slower than that of trace 515 due to the limited current.

As shown by trace 520, the action of the substrate regulating switch of the present invention prevents the substrate potential from rising above ground. The substrate potential is maintained between ground and $V_{BBP}$.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. For example, an integrated circuit having a P-type substrate and an N-well disposed therein is described. More generally, the invention may be used with a semiconductor substrate of either N-type or P-type having a complementary well disposed therein. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

The invention claimed is:

1. A circuit for regulating a substrate potential of an integrated circuit comprising:
   a switch:
   a first input for controlling the switch coupled to a first N-well bias supply line;
   a second input for controlling the switch coupled to a substrate bias supply line;
   a first switching terminal of the switch coupled to a ground; and
   an output terminal of the switch coupled to a P-type substrate, wherein the switch is operable to selectively couple the second input to the output terminal responsive to a voltage of the substrate bias supply line.

2. The circuit of claim 1, wherein the switch is operable to electrically couple the P-type substrate to the ground when a bias voltage is present on the first N-well bias supply line.

3. The circuit of claim 1, wherein the switch is operable to electrically couple the P-type substrate to the substrate bias supply line when a substrate bias voltage is present on the substrate bias supply line.

4. The circuit of claim 1, further comprising a third input for controlling the switch coupled to a second N-well bias supply line.

5. The circuit of claim 4, wherein the switch is operable to electrically couple the P-type substrate to the ground when a bias voltage is present on the second N-well bias supply line.

6. The circuit of claim 4, wherein the switch is operable to electrically couple the P-type substrate to the substrate bias supply line when a substrate bias voltage is present on the substrate bias supply line.

7. The circuit of claim 1, wherein the switch is operable to electrically couple the P-type substrate to the substrate bias supply line when a substrate bias voltage is present on the substrate bias supply line and there is no bias voltage present on the N-well bias line.

8. The circuit of claim 1, wherein the switch is operable to electrically couple the P-type substrate to the ground when a substrate bias voltage is present on the substrate bias supply line and there is no bias voltage present on the N-well bias line.

9. A circuit for regulating the substrate potential of an integrated circuit comprising:
 switch means:
 a first input for controlling the switch means coupled to a first N-well bias supply line;
 a second input for controlling the switch means coupled to a substrate bias supply line;
 a first switching terminal means of the switch means coupled to a ground; and
 an output terminal means of the switch means coupled to a P-type substrate, wherein the switch means is operable to selectively couple the second input to the output terminal means responsive to a voltage of the substrate bias supply line.

10. The circuit of claim 9, wherein the switch means is operable to electrically couple the P-type substrate to the ground when a bias voltage is present on the first N-well bias supply line.

11. The circuit of claim 9, wherein the switch means is operable to electrically couple the P-type substrate to the substrate bias supply line when a substrate bias voltage is present on the substrate bias supply line.

12. The circuit of claim 9, further comprising a third input for controlling the switch means coupled to a second N-well bias supply line.

13. The circuit of claim 12, wherein the switch means is operable to electrically couple the P-type substrate to the ground when a bias voltage is present on the second N-well bias supply line.

14. The circuit of claim 12, wherein the switch means is operable to electrically couple the P-type substrate to the substrate bias supply line when a substrate bias voltage is present on the substrate bias supply line.

15. The circuit of claim 9, wherein the switch means is operable to electrically couple the P-type substrate to the substrate bias supply line when a substrate bias voltage is present on the substrate bias supply line and there is no bias voltage present on the N-well bias line.

16. The circuit of claim 9, wherein the switch means is operable to electrically couple the P-type substrate to the ground when a substrate bias voltage is present on the substrate bias supply line and there is no bias voltage present on the N-well bias line.

17. An integrated circuit for regulating a substrate potential of an integrated circuit comprising:
 a substrate;
 an integrated circuit switch formed on the substrate, the switch including:
  a first input configured for controlling the switch coupled to a first N-well bias supply line, the first N-well bias supply line configured for supplying a biasing voltage to an n-well;
  a second input configured for controlling the switch coupled to a substrate bias supply line, the substrate bias supply line configured for supplying a substrate biasing voltage to the substrate;
  a first switching terminal of the switch coupled to a ground; and
  an output terminal of the switch coupled to the substrate, wherein the switch is operable to selectively couple the second input to the output terminal responsive to a voltage of the substrate bias supply line.

18. The circuit of claim 17, wherein the switch is operable to electrically couple the substrate to the ground when the biasing voltage is present on the first N-well bias supply line.

19. The circuit of claim 17, wherein the switch is operable to electrically couple the substrate to the substrate bias supply line when a substrate biasing voltage is present on the substrate bias supply line.

20. The circuit of claim 17, further comprising a third input configured for controlling the switch coupled to a second N-well bias supply line.

21. The circuit of claim 20, wherein the switch is operable to electrically couple the substrate to the ground when a biasing voltage is present on the second N-well bias supply line.

22. The circuit of claim 17, wherein the switch is operable to electrically couple the substrate to the substrate bias supply line when the substrate biasing voltage is present on the substrate bias supply line.

23. The circuit of claim 17, wherein the switch is operable to electrically couple the substrate to the substrate bias supply line when the substrate biasing voltage is present on the substrate bias supply line and there is no biasing voltage present on the first N-well bias supply line.

24. The circuit of claim 17, wherein the switch is operable to electrically couple the substrate to the ground when the substrate biasing voltage is present on the substrate bias supply line and there is no biasing voltage present on the first N-well bias supply line.

25. A circuit for regulating a substrate potential of an integrated circuit comprising:
 a switch, the switch including:
  a first input for controlling the switch coupled to a first N-well bias supply line;
  a second input for controlling the switch coupled to a substrate bias supply line;
  an output coupled to a substrate;
  a first switching terminal of the switch coupled to a ground; and
  wherein the switch is configured for coupling the output to the first switching terminal responsive to a voltage on the substrate.

26. The circuit of claim 25, wherein the switch is operable to electrically couple the substrate to the ground when a biasing voltage is present on the first N-well bias supply line.

27. The circuit of claim 25, wherein the switch is operable to electrically couple the substrate to the substrate bias supply line when a substrate biasing voltage is present on the substrate bias supply line.

28. The circuit of claim 25, further comprising a third input configured for controlling the switch coupled to a second N-well bias supply line.

29. The circuit of claim 28, wherein the switch is operable to electrically couple substrate to the ground when a biasing voltage is present on the second N-well bias supply line.

30. The circuit of claim 25, wherein the switch is operable to electrically couple the substrate to the substrate bias supply line when a substrate biasing voltage is present on the substrate bias supply line and there is no biasing voltage present on the N-well bias line.

31. The circuit of claim 25, wherein the switch is operable to electrically couple the substrate to the ground when a substrate biasing voltage is present on the substrate bias supply line and there is no biasing voltage present on the N-well bias line.

32. An integrated circuit comprising:
a circuit for regulating the substrate potential of the integrated circuit including:
   a substrate;
   a n-well formed in the substrate;
   a switch, the switch comprising:
      a first input for controlling the switch coupled to the n-well and coupled to a first n-well bias supply line configured for providing a biasing voltage to the n-well;
      a second input for controlling the switch coupled to the substrate and coupled to a substrate bias supply line configured for providing a substrate biasing voltage to the substrate;
      an output of the switch coupled to the substrate;
      a first switching terminal of the switch coupled to a ground; and
   wherein the switch is configured for coupling the output to the first switching terminal responsive to the substrate biasing voltage.

33. The circuit of claim 32, wherein the switch is operable to electrically couple the substrate to the ground when the biasing voltage is present on the first n-well bias supply line.

34. The circuit of claim 32, wherein the switch is operable to electrically couple the substrate to the substrate bias supply line when the substrate biasing voltage is present on the substrate bias supply line.

35. The circuit of claim 32, further comprising a third input configured for controlling the switch coupled to a second n-well bias supply line.

36. The circuit of claim 35, wherein the switch is operable to electrically couple the substrate to the ground when a biasing voltage is present on the second n-well bias supply line.

37. The circuit of claim 32, wherein the switch is operable to electrically couple the substrate to the substrate bias supply line when the substrate biasing voltage is present on the substrate bias supply line.

38. The circuit of claim 32, wherein the switch is operable to electrically couple the substrate to the substrate bias supply line when a substrate biasing voltage is present on the substrate bias supply line and there is no biasing voltage present on the n-well bias line.

39. The circuit of claim 32, wherein the switch is operable to electrically couple the substrate to the ground when the substrate biasing voltage is present on the substrate bias supply line and there is no biasing voltage present on the n-well bias line.

* * * * *

UNITED STATES PATENT AND TRADEMARK OFFICE
CERTIFICATE OF CORRECTION

PATENT NO. : 7,642,835 B1 Page 1 of 1
APPLICATION NO. : 10/712523
DATED : January 5, 2010
INVENTOR(S) : Fu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 231 days.

Signed and Sealed this

Sixteenth Day of November, 2010

David J. Kappos
*Director of the United States Patent and Trademark Office*